United States Patent
John et al.

(10) Patent No.: US 7,815,969 B2
(45) Date of Patent: Oct. 19, 2010

(54) DIAMOND SHELL WITH A GEOMETRICAL FIGURE AND METHOD FOR FABRICATION THEREOF

(75) Inventors: Phillip John, Edinburgh (GB); Jae Kap Lee, Seoul (KR)

(73) Assignees: Korea Institute of Science and Technology, Seoul (KR); Heriot-Watt University, Edinburgh (GB)

( * ) Notice: Subject to any disclaimer, the term of this patent is extended or adjusted under 35 U.S.C. 154(b) by 468 days.

(21) Appl. No.: 10/574,264

(22) PCT Filed: Oct. 19, 2005

(86) PCT No.: PCT/KR2005/003486
§ 371 (c)(1),
(2), (4) Date: Mar. 31, 2006

(87) PCT Pub. No.: WO2006/043780
PCT Pub. Date: Apr. 27, 2006

(65) Prior Publication Data
US 2008/0166479 A1    Jul. 10, 2008

(30) Foreign Application Priority Data
Oct. 19, 2004    (KR) .................. 10-2004-0083710

(51) Int. Cl.
*C23C 16/27* (2006.01)
(52) U.S. Cl. .............................. 427/249.8; 427/249.12; 427/249.9
(58) Field of Classification Search ............... 427/249.8
See application file for complete search history.

(56) References Cited

U.S. PATENT DOCUMENTS

| | | | |
|---|---|---|---|
| 5,114,745 A * | 5/1992 | Jones | 427/113 |
| 5,334,283 A | 8/1994 | Parikh | |
| 5,478,513 A | 12/1995 | Kosky | |
| 5,486,263 A | 1/1996 | Dautremont-Smith | |
| 5,869,133 A * | 2/1999 | Anthony et al. | 427/249.8 |
| 6,068,883 A | 5/2000 | Deguchi | |
| 7,309,446 B1 * | 12/2007 | Kley | 216/11 |
| 2002/0168836 A1 | 11/2002 | Noguchi | |
| 2004/0177803 A1 | 9/2004 | Scarsbrook | |
| 2004/0199260 A1* | 10/2004 | Pope et al. | 623/23.5 |

FOREIGN PATENT DOCUMENTS

KR    2002-0023502    3/2002

OTHER PUBLICATIONS

U.S. Appl. No. 60/547,934, Kley, Provisional application filed Feb. 25, 2004.*

(Continued)

*Primary Examiner*—Timothy H Meeks
*Assistant Examiner*—Joseph Miller, Jr.
(74) *Attorney, Agent, or Firm*—Fish & Richardson P.C.

(57) ABSTRACT

This invention provides a method for fabricating geometrical diamond/matrix composites where all or a part of surfaces of the matrix are covered with a diamond film, and to fabricate hollow diamond shells using the composites where a part is uncoated with a diamond film. Hollow diamond shells were prepared by etching out of the matrix soluble with chemicals through an opening, a zone on the matrix, uncoated with diamond film. By changing the shape and the size of the geometrical matrixes, various kinds of diamond/matrix composites and diamond shells in shape and in size can be fabricated. The sizes available are between 200 nm and 2 mm.

6 Claims, 2 Drawing Sheets

OTHER PUBLICATIONS

U.S. Appl. No. 60/557,786, Kley, Provisional application filed Mar. 29, 2004.*

U.S. Appl. No. 60/550,571, Kley, Provisional application filed Mar. 3, 2004.*

* cited by examiner

DIAMOND SHELL WITH A GEOMETRICAL FIGURE AND METHOD FOR FABRICATION THEREOF

REFERENCE TO RELATED APPLICATIONS

This application is a national stage of PCT/KR2005/003486, filed Oct. 19, 2005, and which claims the benefit of priority to Korean Application No. 83710/2004, filed Oct. 19, 2004.

BACKGROUND OF THE INVENTION

1. Field of the Invention

The present invention relates to a diamond film synthesizing technology by chemical vapor deposition (CVD).

2. Description of the Background Art

Diamond can be synthesized by high pressure and high temperature (HPHT), detonation and chemical vapor deposition (CVD) methods.

The HPHT method of which condition is 1500° C. of temperature and 50,000 atmosphere of pressure enables us to synthesize grit-type diamonds where sizes are below hundreds pm in diameter or irregular shaped diamond powders in the micrometer range in size. Nanometer scale diamond powders can be synthesized by the detonation method of which condition is 1000° C. of temperature and 300,000 atmosphere of pressure. A typical shape of diamond synthesized under HPHT methods including the detonation method is a powder (or particle) type.

On the other hand, CVD method of which condition is around 700° C. of temperature and around 40-200 Torr of pressure deposits diamond onto substrates (or matrix), normally silicon wafers. CVD diamond also can be coated on curved substrate such as drills and inserts. During deposition, the substrates are placed on a plate or held in a stage. Free-standing diamond films can be prepared if the substrate is removed by etching.

However, CVD method cannot deposit diamond films on whole surfaces of substrates because a part of a substrate is in contact with a plate or a stage where diamond deposition is not available. Also, hollow diamond shells have never been prepared with previous arts yet.

SUMMARY OF THE INVENTION

Therefore, an object of the present invention is to provide a geometrical diamond/matrix composite where surfaces of the matrixes can be covered fully or partially with diamond films (also recited as "fully covered composite" and a "partially covered composite", respectively)

Another object of the present invention is to provide a hollow diamond shell by etching the matrix out from the partially covered composites on which a part of the surface is uncoated with diamond films.

Still another object of the present invention is to provide a diamond/matrix composite and a hollow diamond shell in the range between 200 nm and 2 mm in size.

To achieve these and other advantages and in accordance with the purpose of the present invention, as embodied and broadly described herein, there is provided a method for fabricating a diamond with geometrical shape, comprising: preparing a matrix with a geographical figure, making a diamond/matrix composite by synthesizing a diamond film on the surface of the matrix by CVD method. By vibrating the matrix, the surface of the matrix can be covered fully with diamond films. A diamond/matrix composite with being partially uncovered with a diamond can be a diamond shell through etching the matrix out of the composite.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

In accordance with the present invention, the matrix has variable shape such as a sphere, a polyhedron or an irregular shape. The matrix must be appropriate for synthesizing a diamond thereon, and should be preferably dissolved to a chemical etching solution.

An apparatus to be used for synthesizing a diamond film is such as a hot filament CVD apparatus, a microwave CVD apparatus, or a DC plasma apparatus. Similar synthesizing conditions to the conventional methods can be applied. The growth rate of a diamond film is in the range of 1~20 μm/h depending an apparatus used. The thickness of a diamond film to be formed can be controlled by varying the synthesizing conditions and synthesizing time.

"Fully covered composite" is completely fabricated by only depositing a diamond film on a matrix with a geographical figure. On the contrary, "partially covered composite" includes etching step for removing the matrix from the composite.

For the fully covered composite, all the surface of the matrix must contact with a gas phase of source material. Vibration can be adapted to a plate (in a CVD apparatus) on which a matrix is placed to let the matrix move or rotate during deposition so that all surfaces can be exposed to plasma (gas phase).

In case of the partially covered composite, at least one opening site (at which a diamond film does not cover) must be provided on the matrix during the synthesis of the diamond film. The opening (or opening site) allows etching material to enter to remove the matrix. It can be made naturally during deposition because the bottom zone of the matrix in contact with the plate will be free from diamond films.

The opening also can be controlled during pre-treatment of the matrix for inciting nucleation of diamond particles. Practically, to deposit diamond film effectively, the silica was pre-treated by using diamond powders agents dispersed in methanol in an ultrasonic bath. In this pretreatment, the surface of the silica ("matrix") has defects, which promotes nucleation of diamond. If we block a zone on the surface of the matrix from agents the zone should be free from diamond films. With an etching the matrix out by chemicals finally hollow diamond shells can be fabricated. Alternatively, the opening(s) on the template matrix particles can be obtained by attaching them onto glue tapes during the pretreatment so that the attached part of the matrix particles is not in contact with the diamond powders agents to avoid formation of diamond nuclei.

In the process for fabricating the diamond shells, the etching rate can be increased by boiling the etching solution or adapting vibration onto the composites.

Reference will now be made in detail to the preferred embodiments of the present invention, examples of which are illustrated in the accompanying drawings.

Figure 1:
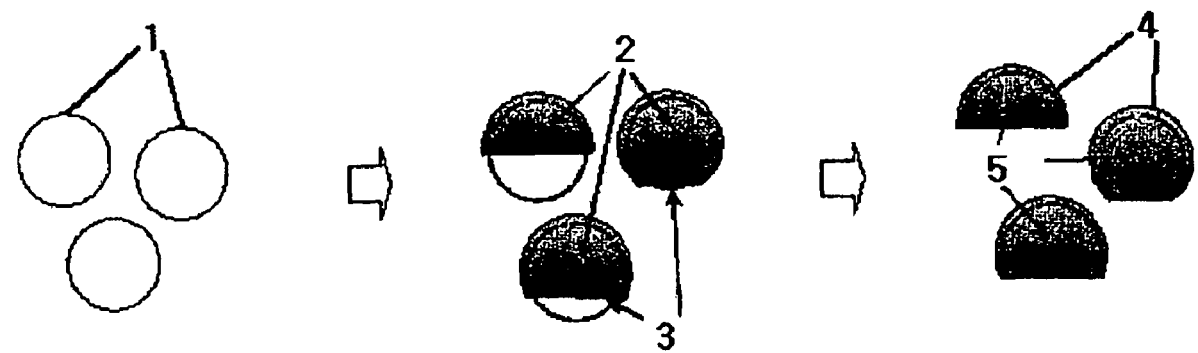
FIG. 1 shows a schematic view of the process making diamond/matrix composite and diamond shell.

As shown in FIG. 1, spherical matrixes (silica, $SiO_2$) 1 are prepared. Diamond films 2 are coated on their surfaces with a conventional CVD diamond deposition apparatus, and diamond/silica composites are prepared. For a diamond shell there needs an opening 3 on the surface of the matrix 1. Silica is etched out of diamond/silica composites, thereby a diamond shell 4 with a hollow inner space being obtained.

Figure 2:
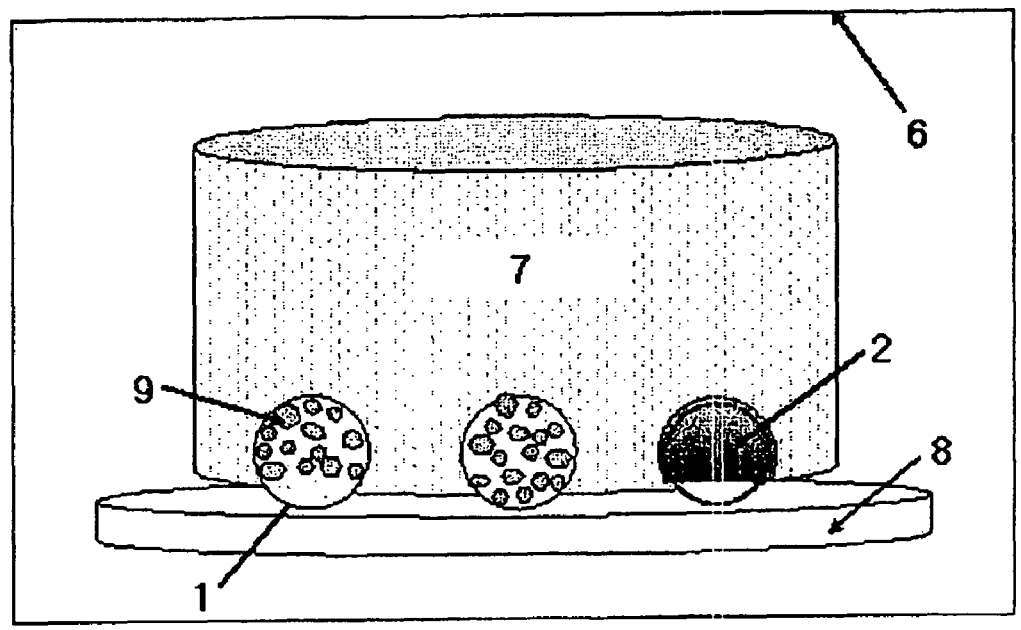
FIG. 2 shows a schematic view of diamond deposition by CVD method.

FIG. 2 shows a schematic view of diamond deposition by CVD method. Plasma 7 is generated in a vacuum chamber 6 to activate a source gas (i.e., H2+methane). Silica 1, as a matrix, is placed on a plate 8. Main conditions for depositing a diamond are controlled as follows: 1-20% $CH_4$ in the source gas, 10-200 Torr of vacuum pressure, 600-1000 Celsius degree of deposion temperature. The diamond is synthesized by the four steps of nucleation, growth of nuclei, film formation, and growth of film. The size of diamond particles and films can be controlled by varying the deposition time. If vibration is not applied, a contact part of the matrix 1 with the plate 8 is not deposited with a diamond and functions as an opening for etching the matrix.

During the deposition, the micro structure of the synthesized diamond can be varied as (100) crystal structure, mixed (100) and (111) structure, or nanodiamond structure according to the variation of source gas composition.

We can also get a lot of diamond particles 9 in the range of tens nm—tens μm in size if we stop diamond deposition at the initial stage where independent diamond particles are formed on the template matrix, that is, before film formation (see FIG. 2), and etch the matrix which is a geometrical particle.

Figure 3:
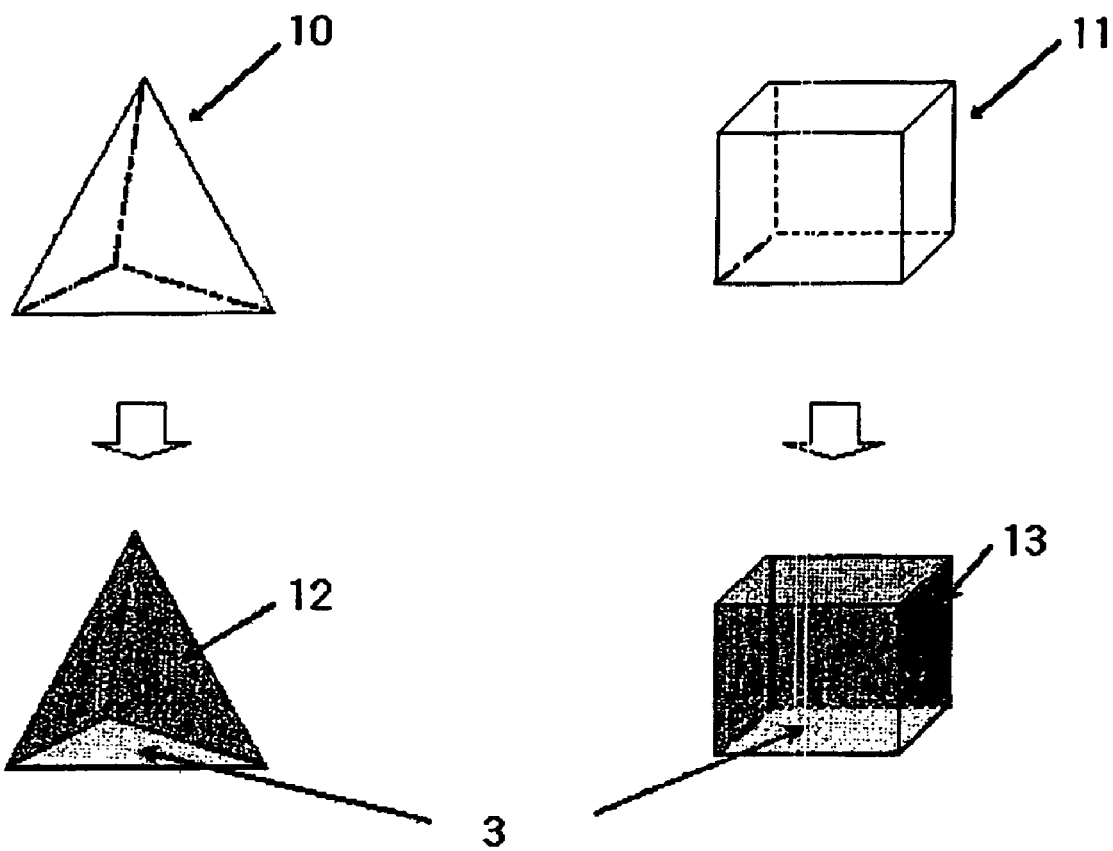
FIG. 3 shows a schematic view of making diamond shells with shapes of a pyramid and a box, by using template matrixes with the shapes of a pyramid and a cubic, respectively.

As shown in FIG. 3, if the shape of the matrix is changed into a tetrahedral shape 10 or a hexahedral shape 11, we can get various kinds of diamond/matrix composite and hollow diamond shells, such as a pyramid shape 12, or a box shape 13.

EXAMPLE 1

Diamond film was deposited on silica spheres in the range between 50 and 100 μm in diameter with a 0.5 kW microwave plasma enhanced CVD apparatus under 40 Torr of pressure, 650° C. of temperature and 200 sccm of flow rate for 10 hours. Biasing was adopted to enhance nucleation density during diamond growth. Prior to the deposition the silica spheres were pretreated in an ultrasonic bath for 1 hour by using the diamond powders agents.

In SEM observation, some silica spheres revealed diamond films covered partially. Others revealed diamond islands. Morphology was (100) dominant, (100) and (111) mixed and nano-structured with particles.

EXAMPLE 2

Silica particles in the range between 50 μm and 100 μm in diameter were coated with a multi-cathode direct current PECVD under 15 kW of power, 10% of methane composition in hydrogen and 100 Torr of pressure for 1 hour and a half. The temperature, that measured by a pyrometer but is not real one because of misleading by emission from hot cathodes kept over 2000° C., was expected to be around 700° C. A part of each particle was coated with diamond films, while its other part was uncoated and this part is considered to be in contact with the plate. XRD analysis of the composites showed clear diamond peaks, (111), (220) and (311). Surface morphology revealed (100) and (111) facets mixed meaning <110> textured films.

When silica with more than 2 mm in diameter was used, a uniform deposition of diamond was difficult due to concentration of plasma on the upper surface of the silica caused by temperature differences between the upper and under part thereof. On the contrary, When silica with less than 2 nm in diameter was used, independently formed silica particles cannot be obtained due to agglomeration thereof.

EXAMPLE 3

A diamond deposition was performed at 11% of methane concentration under the same condition of example 2. A part of each particle was coated with diamond films, while its other part was bare. Surface revealed square (100) facets prevailing morphology.

EXAMPLE 4

A diamond deposition was performed at 12% of methane concentration under the same condition of example 2. Deposition behaviors were similar to those of example 2. However, surface revealed nano-crystalline morphology. Some particles showed cauliflower morphology with enormous numbers of (100) facets partially.

EXAMPLE 5

A diamond deposition was performed on silica particles under the same condition of example 2. Vibrations were adapted onto the plate during deposition on which samples were placed. All surfaces of the particle were covered with diamond films revealing (100) and (111) facets mixed.

EXAMPLE 6

To make hollow diamond shells the diamond/silica composites with the opening prepared in example 2, 3 and 4 were treated in 10% HF solution at room temperature for 30 minutes and then in boiling Murakami's solution(3 g NaOH, 30 g K-hexacyanoferrate(III), 60 ml $H_2O$) for 10 minutes. Hollow diamond shells were successfully obtained by etching the silica out with this treatment. The film thickness of the diamond shells was about 10 μm.

EXAMPLE 7

A diamond deposition was performed for 30 minutes under the same condition with example 2. Diamond particles, which have grown from diamond nuclei formed on the matrix, were observed. Some particles were independent while other particles were dependent each other similar to short range diamond films. Their size was between tens nm and tens μm, and surface morphology revealed (100) and (111) facets mixed meaning <110> textured films. The samples, diamond particles/matrix, were put into the chemicals and etched with the same methods described in the Example 6. These etchings leaved CVD diamond particles in the range from tens nm and tens μm in size.

The present invention can prepare micro geometrical diamond/matrix composites where surfaces of the matrix can be partially covered with diamond films and hollow diamond shells from the composites by using CVD process, diamond deposition on the matrix and etching the matrix out. These materials can be used as biochip materials, electrode materials of field emission display (FED) and any other new functional materials. Especially, the hollow diamond shells are useable in the field of preservation of samples e.g. DNA, cells, chemicals, pharmaceutical applications controlled release of drugs, chemicals in creams and lotions, cosmetic controlled release of perfumes, dyes, etc and chemical industry paints.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a hollow diamond shell with geometrical shape, comprising:
   preparing a matrix with a geometrical shape;
   pretreating the matrix by using diamond powder agents in an ultra-sonic bath to incite nucleation of diamond on the matrix while blocking a zone on the surface of the matrix from the diamond powder agents;
   synthesizing a diamond film on the matrix by CVD process to form a diamond/matrix composite, said composite being partially uncoated with the diamond film to have an opening site corresponding to the zone; and
   etching the matrix of the composite partially uncoated with the diamond film through the opening site to obtain a hollow diamond shell.

2. The method of claim 1, wherein the size of the matrix is in the range between 200 mn and 2 mm in the longest length.

3. The method of claim 1, further comprising the step of applying vibrations to a plate on which the matrix is placed, to let the matrix move and rotate.

4. The method of claim 1, wherein the matrix has a spherical shape.

5. The method of claim 1, wherein an opening on the matrix is formed by attaching glue tapes during the pretreatment.

6. The method of claim 1, wherein the diamond film formed on the matrix has a (100) prevailing surface or nanocrystaline morphology.

* * * * *